United States Patent [19]
Shirai et al.

[11] Patent Number: 6,091,294
[45] Date of Patent: Jul. 18, 2000

[54] AMPLIFIER CIRCUIT

[75] Inventors: Takahiro Shirai, Isehara; Shinichi Yamashita, Yokohama, both of Japan

[73] Assignee: Canon Kabushiki Kaisha, Tokyo, Japan

[21] Appl. No.: 09/150,564

[22] Filed: Sep. 10, 1998

[30] Foreign Application Priority Data

Sep. 18, 1997 [JP] Japan ................................ 9-270337

[51] Int. Cl.[7] ............................... H03F 3/45; H03F 3/68
[52] U.S. Cl. ............................................. 330/69; 330/84
[58] Field of Search ........................... 330/69, 84, 124 R, 330/256; 323/313, 314

[56] References Cited

U.S. PATENT DOCUMENTS

| 3,566,298 | 2/1971 | Stevens | 330/84 |
| 4,929,909 | 5/1990 | Gilbert | 330/256 |
| 5,027,081 | 6/1991 | Baum | 330/69 X |
| 5,510,751 | 4/1996 | Nauta | 330/84 |

OTHER PUBLICATIONS

EDN Electrical Design News, vol. 37, No. 4, pp. 133–136, Feb. 17, 1992, XP000292859, "Op–amp Distortion Measurement Bypass Test–Equipment Limits Designer's Guide To Measuring Op–amp Distortion Part 1".

IEEE Journal of Solid–State Circuits, vol. 27, No. 12, pp. 1723–1729, Dec. 1, 1992, XP000329021, "A Highly Efficient CMOS Line Driver with 80–dB Linearity for ISDN U–Interface Applications".

Primary Examiner—Steven J. Mottola
Attorney, Agent, or Firm—Robin, Blecker & Daley

[57] ABSTRACT

An amplifier circuit for amplifying an input signal and outputting the amplified signal includes a first amplifier for outputting from a first output terminal a current proportional to a difference voltage between voltages at a first input terminal and a second input terminal, and a second amplifier for outputting from a second output terminal a current proportional to a difference voltage between voltages at the first input terminal and the second input terminal and for feeding back a current outputted from the second output terminal to the second input terminal, so that the amplifier circuit is operable at a supply voltage of 3 V.

9 Claims, 6 Drawing Sheets

AMPLIFIER CIRCUIT

BACKGROUND OF THE INVENTION

1. Field of the Invention

The present invention relates to an amplifier circuit for outputting an input signal at a specific output impedance, and in particular, to an amplifier circuit that is built in a video camera and the like and is used for amplifying a video signal and the like.

2. Description of Related Art

Conventionally, since an output impedance is specified at 75 ohms in an amplifier circuit for outputting a video signal, the amplifier circuit outputs a signal through a resistor of 75 ohms by driving the signal in a low-impedance output amplifier circuit, the signal being twice as large as a signal at a 75-ohm terminating resistor.

Nevertheless, it is necessary for the conventional amplifier circuit to output a signal of 2 Vpp in the low-impedance output amplifier circuit so as to output a video signal having an amplitude of 1 Vpp. Therefore, a supply voltage of at least 4 V is required if the low-impedance output amplifier circuit is to be constructed of a push-pull circuit with bipolar transistors.

In addition, if the low-impedance output amplifier circuit is constructed in a collector-output type, it is possible to lower the supply voltage to a degree. Nevertheless, it is difficult to operate the low-impedance output amplifier circuit at the supply voltage of 3 V.

Recently, supply voltages have been reduced so as to get longer battery lives in portable apparatuses, with the operation of 3 volt power supplies also being requested in video cameras. Nevertheless, it is not possible for the conventional art to correspond to these requirements.

BRIEF SUMMARY OF THE INVENTION

An object of the present invention is to provide an amplifier circuit which is operable at a supply voltage of 3 V.

To attain the above objects, in accordance with an aspect of the present invention, there is provided an amplifier circuit for amplifying an input signal and outputting the amplified signal, which comprises a first amplifier for outputting from a first output terminal a current proportional to a difference voltage between voltages at a first input terminal and a second input terminal, and a second amplifier for outputting from a second output terminal a current proportional to a difference voltage between voltages at the first input terminal and the second input terminal and for feeding back a current outputted from the second output terminal to the second input terminal.

The above and further objects and features of the present invention will become apparent from the following detailed description of a preferred embodiment thereof taken in conjunction with the accompanying drawings.

DETAILED DESCRIPTION OF THE INVENTION

Hereinafter, a preferred embodiment of the present invention will be described in detail with reference to the drawings.

Figure 1:
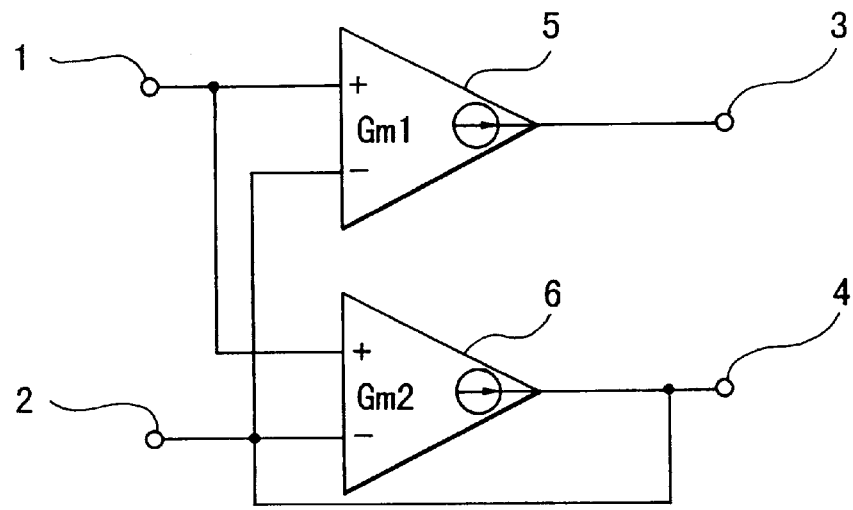
FIG. 1 is a diagram showing the fundamental construction of an amplifier circuit according to an embodiment of the present invention.

FIG. 1 is a diagram showing the fundamental construction of an amplifier circuit according to the embodiment. In FIG. 1, reference numeral 1 denotes a first input terminal, reference numeral 2 denotes an second input terminal, reference numeral 3 denotes a first output terminal, reference numeral 4 denotes a second output terminal, reference numeral 5 denotes a first Gm amplifier for outputting a current to the first output terminal 3, and reference numeral 6 denotes a second Gm amplifier for outputting a current to the second output terminal 4.

Figure 2:
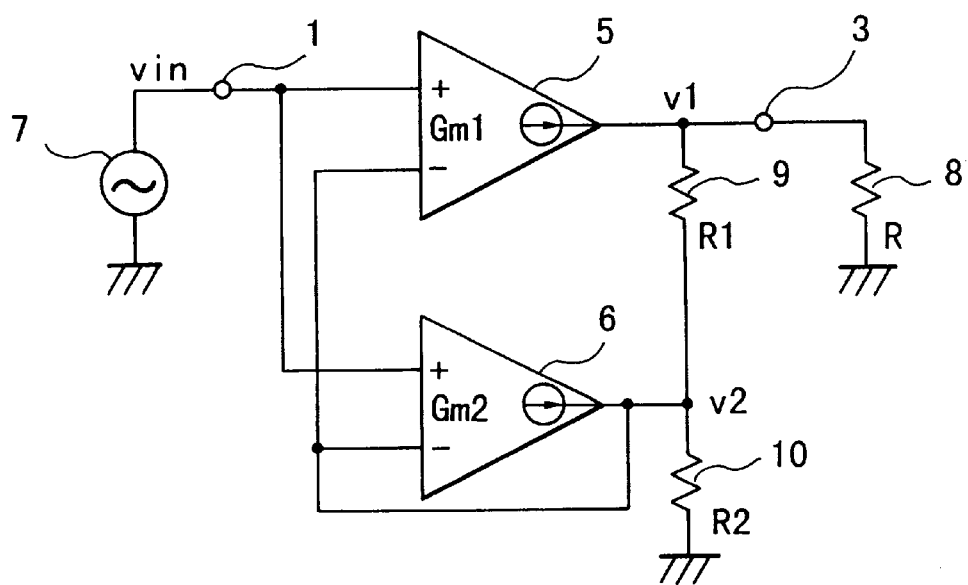
FIG. 2 is a diagram showing a state of a signal source being connected to an input terminal of the amplifier circuit shown in FIG. 1 so as to adjust (set) an input-output gain.

FIG. 2 is a diagram showing the structure for measuring the input-output gain of the amplified circuit used in this embodiment, in which the signal source 7 is connected to the first input terminal 1.

In FIG. 2, reference numeral 7 denotes an input signal source, reference numeral 8 denotes a terminating resistor, and reference numerals 9 and 10 denote feedback resistors. FIG. 2 also shows conductances (Gm's) of a first Gm amplifier 5 and a second Gm amplifier 6, Gm1 and Gm2, respectively, and resistances of a terminating resistor 8 and feedback resistors 9 and 10, R, R1 and R2, respectively. In addition, an input signal is vin, and voltages of first output terminal 3 and second output terminal 4 are v1 and v2, respectively. The following formulas (1) and (2) can be obtained according to Kirchhoff's first law at the first output terminal 3 and the second output terminal 4:

$$Gm1(vin-v2)-v1/R-(v1-v2)/R1=0 \quad (1)$$

$$Gm2(vin-v2)-v2/R+2(v1-v2)/R1=0 \quad (2)$$

By expressing the voltage v1 with the input signal vin from the formulas (1) and (2), the following formula (3) can be obtained:

$$v1=R(R1Gm1+R2Gm1+R2Gm2)/(R(1+R2Gm1+R2Gm2)+R1+R2+R1R2Gm2)\cdot vin \quad (3)$$

By means of this construction, the input-output gain is determined by deciding the respective values of the resistances R, R1, and R2 and the conductances Gm1 and Gm2.

Figure 3:
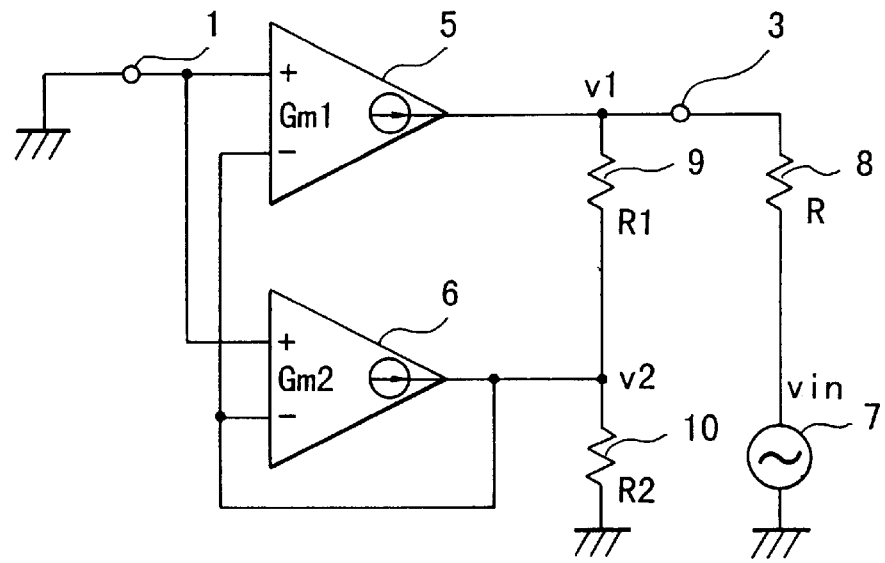
FIG. 3 is a diagram showing a state of a signal source being connected to an output terminal of the amplifier circuit shown in FIG. 1 so as to adjust (set) an output impedance.

FIG. 3 is a diagram showing the structure for measuring the output impedance of the amplified circuit used in this embodiment, in which the signal source 7 is connected to the first output terminal 3. The following formulas (4) and (5) are obtained when the Kirchhoff's first law is applied to the first output terminal 3 and the second output terminal 4, similar to the above:

$$(v1-vin)/R+Gm1v2+(v1-v2)/R1=0 \quad (4)$$

$$v2/R2+Gm2v2-(v1-v2)/R1=0 \quad (5)$$

By expressing the voltage v1 with the input signal vin from the formulas (4) and (5), the following formula (6) can be obtained:

$$v1=(R1+R2+R1R2Gm2)/(R1+R2+R1R2Gm2+R(1+R2Gm1+R2Gm2))\cdot vin \quad (6)$$

Letting an output impedance at the time of viewing the circuit side from the first output terminal 3 be Z, the formula (6) can be expressed as the following formula (7), and further the output impedance Z is expressed by the following formula (8):

$$v1=(Z/(Z+R))\cdot vin \quad (7)$$

$$Z=(R1+R2+R1R2Gm2)/(1+R2(Gm1+Gm2)) \quad (8)$$

As described above, by using accurate external resistors as the resistances R1, R2 and R and improving the accuracy of the conductances Gm1 and Gm2, it becomes possible to realize the amplifier circuit having a constant output impedance and a constant input-output gain at the time of the terminating resistor being resistance R.

Therefore, by adjusting an output level at the time of termination while performing the feedback so that the output impedance becomes 75Ω, it becomes possible to construct the amplifier circuit which is operable at a supply voltage of 3 V.

Figure 4:
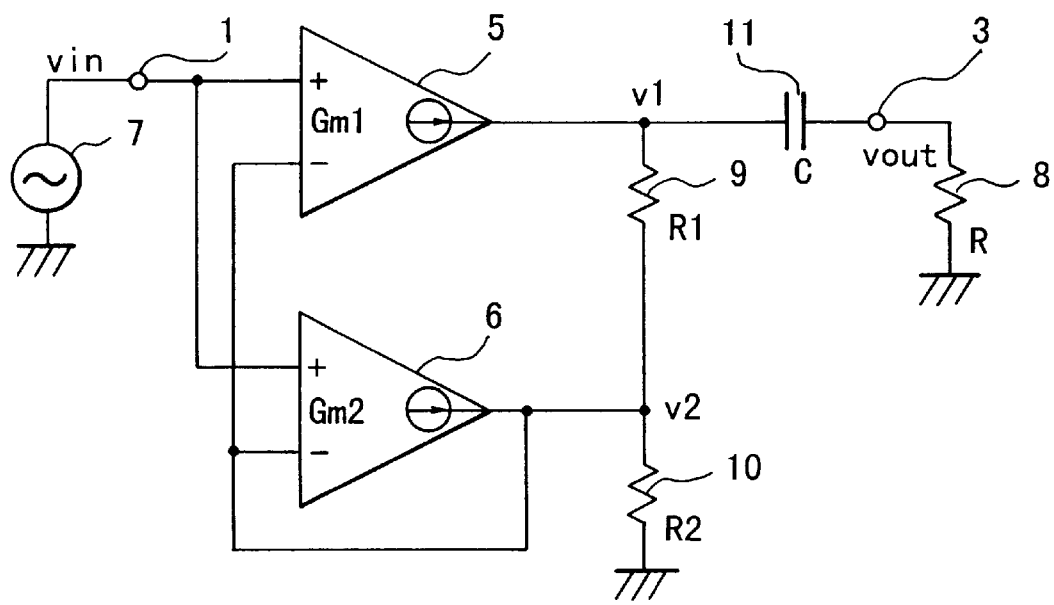
FIG. 4 is a diagram showing the construction at the time of further outputting a signal through capacitive coupling in the amplifier circuit shown in FIG. 1.

Next, sag correction in an amplifier circuit will be described. Since a video signal is outputted in alternating current and is terminated in the receiving side, the video signal is usually outputted through capacitive coupling (a capacitor). FIG. 4 is a diagram showing the structure of an amplifier circuit for outputting a signal through the capacitive coupling.

Since a frequency characteristic decreases in the lower frequency domain of a video signal due to a time constant of RC in case of termination through the capacitive coupling 11, a sag arises in the video signal, resulting in uneven luminance on a picture.

In order to prevent this, it is necessary to correct the reduction of the frequency characteristic at the output terminal by performing feedback of the video signal after the capacitive coupling to the second input terminal.

Figure 5:
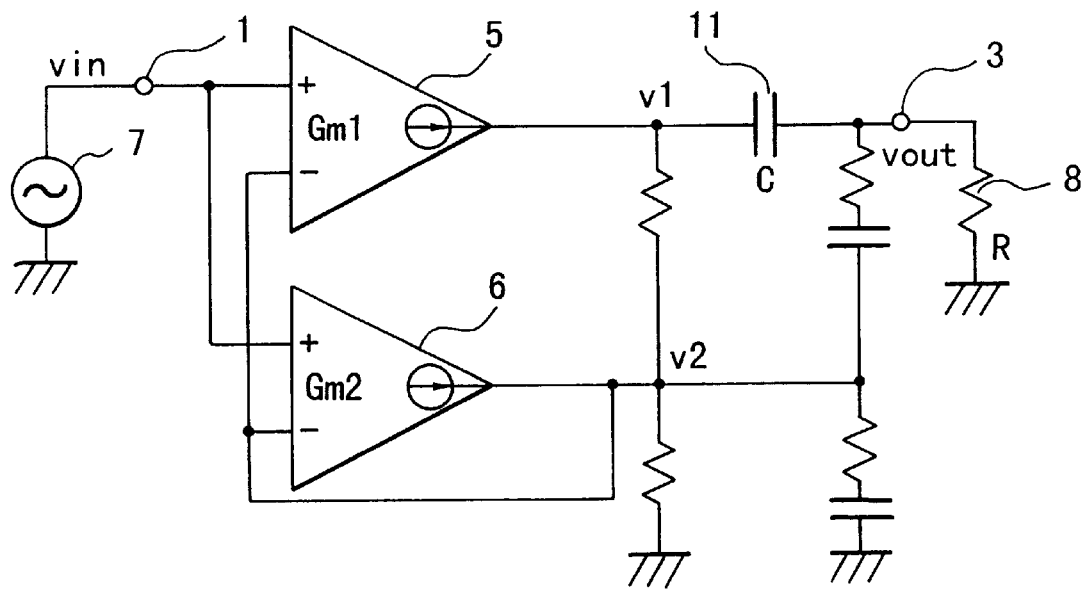
FIG. 5 is a diagram showing the construction at the time of a feedback circuit further being provided for performing feedback of a signal outputted through the capacitive coupling to a second input terminal in the amplifier circuit shown in FIG. 1.
Figure 6:
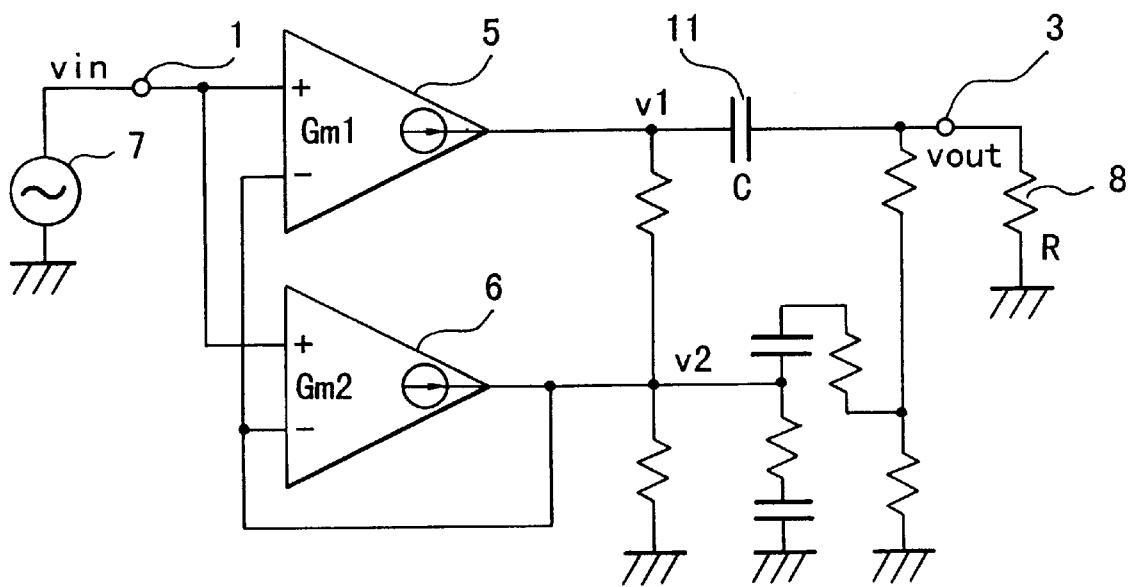
FIG. 6 is a diagram showing another construction at the time of a feedback circuit further being provided for performing feedback of a signal outputted through the capacitive coupling to a second input terminal in the amplifier circuit shown in FIG. 1.
Figure 7:
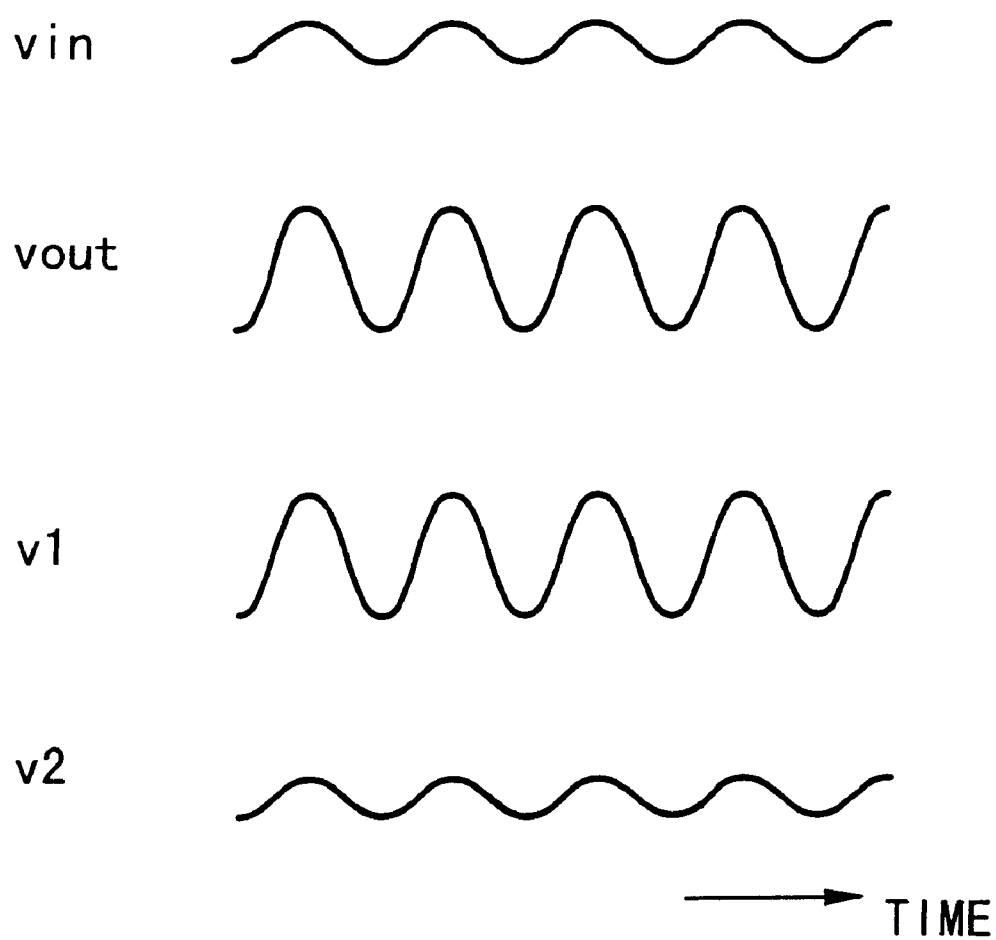
FIG. 7 is a timing chart showing waveforms of respective portions in the amplifier circuit shown in FIG. 5 or 6.

FIG. 5 is a diagram showing the construction of the amplifier circuit having a feedback circuit for performing the feedback of the video signal after the capacitive coupling to the second input terminal. FIG. 6, similarly to FIG. 5, is a diagram showing the construction of the amplifier circuit having a feedback circuit for performing the feedback of the video signal after the capacitive coupling to the second input terminal. The feedback circuit shown in FIG. 5 is stable when there is not a terminating resistor, and the feedback circuit shown in FIG. 6 has a good frequency characteristic. FIG. 7 is a timing chart showing signal waveforms of the respective portions in the amplifier circuit shown in FIG. 5 or FIG. 6.

Incidentally, although a resistor and a capacitor are connected in series between the terminal of the output side of the capacitive coupling 11 and the second output terminal in FIG. 5, only the capacitor can be also connected. Although a resistor and a capacitor are connected in series between the connecting point of two resistors, connected in series between the terminal of the output side of the capacitive coupling 11 and the ground, and the second output terminal in FIG. 6, only the capacitor can be also connected.

Figure 8:
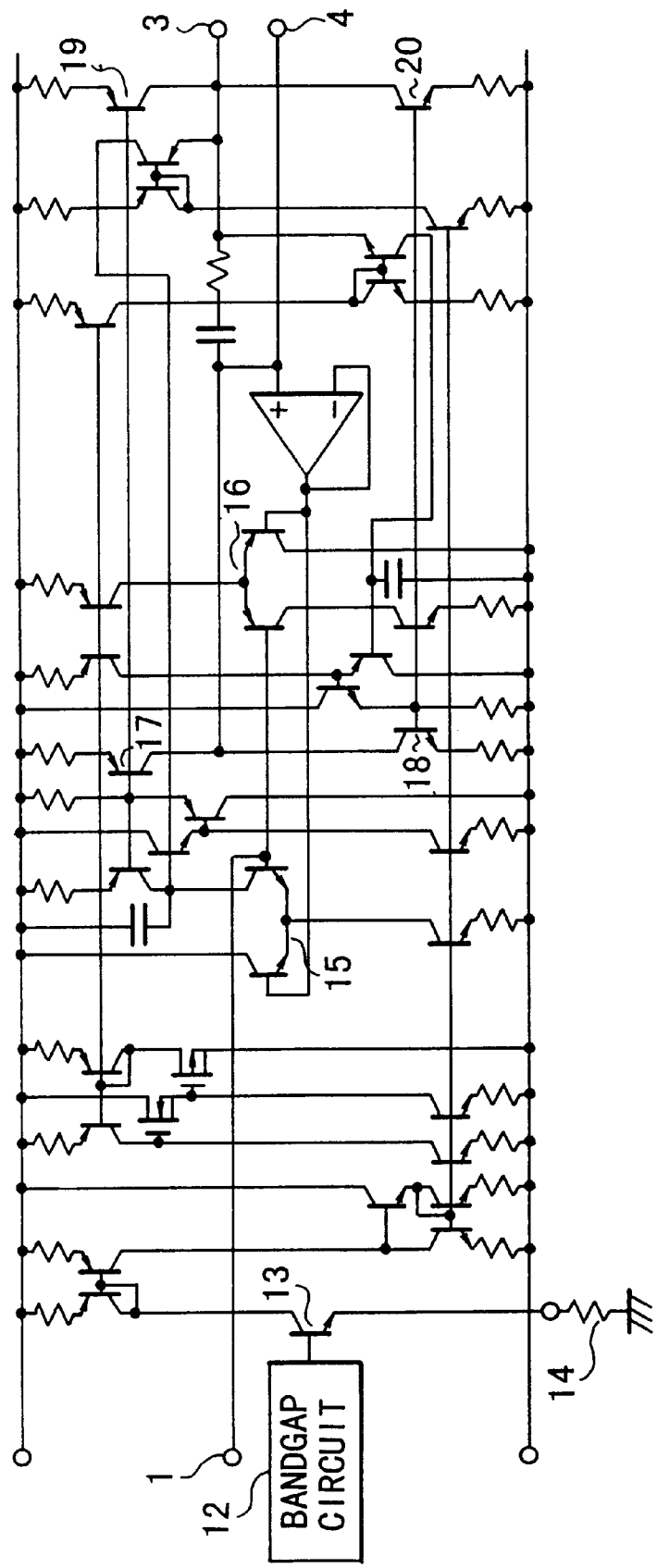
FIG. 8 is a diagram showing the concrete construction of the amplifier circuit shown in FIG. 1.

FIG. 8 is a diagram showing the concrete construction of the amplifier circuit shown in FIG. 1. The amplifier circuit has a bandgap circuit 12. A bandgap voltage generated in the bandgap circuit 12 is inputted to the base of an NPN transistor (Tr) 13, and an external resistor 14 is connected between the emitter of the NPN transistor 13 and the ground (GND).

Figure 9:
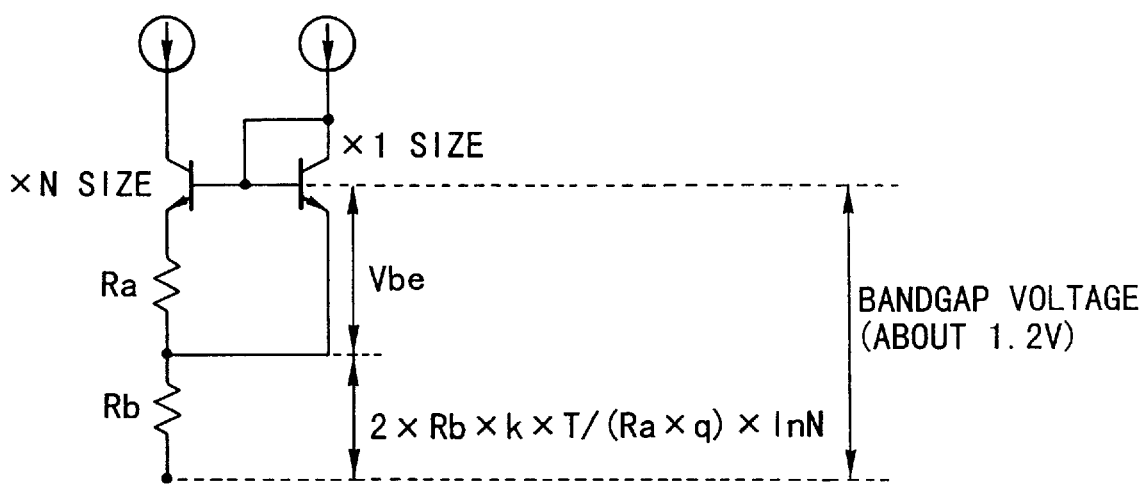
FIG. 9 is a diagram for explaining the principle of operation of a bandgap circuit in the amplifier circuit shown in FIG. 8.

Here, the details of the bandgap circuit 12 will be described. FIG. 9 is a diagram showing the principle of operation of the bandgap circuit 12. A bandgap circuit is a circuit for outputting a bandgap voltage (about 1.2 V) for silicon, and has a characteristic that is not fluctuated by temperature. Concretely, a resistor Ra is connected to the emitter of a transistor having N times the size between two transistors having different sizes (1:N), and the same base potential is given to the two transistors so that the same collector currents may flow. The value of the collector current i flowing at this time is shown in the following formula (9), where T represents absolute temperature, k represents the Boltzman's constant, and q represents an electric charge.

$$i=kT\cdot\ln N/(Ra\cdot q) \quad (9)$$

Here, by making the collector current i flow through a resistor Rb and adding a voltage between both ends of the resistor Rb to a base-emitter voltage Vbe, a voltage Vbandgap that is not fluctuated by temperature can be obtained as shown in the following formula (10):

$$Vbandgap=Vbe+2\cdot(Rb/Ra)\cdot(k\cdot\ln N/q)\cdot T \quad (10)$$

According to the formula (10), it can be seen that a voltage obtained by subtracting the base-emitter voltage Vbe from the bandgap voltage Vbandgap is proportional to the absolute temperature T. By performing current transformation of this voltage with the resistance R, the obtained current is proportional to the absolute temperature T.

In addition, conductance gm at the time of making a current I flow into a differential input circuit is shown in the following formula (11):

$$gm=q\cdot I/(k\cdot T) \quad (11)$$

Therefore, by making a current proportional to the absolute temperature T flow into the differential input circuit, it becomes possible to generate the conductance gm not depending on temperature.

In this manner, the collector current of the NPN transistor (Tr) 13 shown in FIG. 8 becomes proportional to the absolute temperature. Then, by making currents, mirrored from the collector current of the NPN transistor 13, flow into emitter-coupled differential input circuits 15 and 16, the emitter-coupled differential input circuits 15 and 16 can have conductances (Gm's) of a characteristic not depending on temperature.

Moreover, output currents from the emitter-coupled differential input circuits 15 and 16 are mirrored by transistors 17 and 18, and are outputted to the second output terminal 4. Furthermore, the currents are mirrored by transistors 19 and 20, and are outputted to the first output terminal 3.

In an amplifier circuit capable of correcting the sag, the less the capacitor in the feedback circuit is, the better it is from the viewpoint of part cost and size, so that the larger the resistor used in the feedback circuit is, the better it is. On the other hand, it becomes possible to make the output impedance obtained from FIG. 3 small by putting conductances in Gm1>>Gm2, and, at this time, the output impedance becomes Z≈R1 (Gm2/Gm1).

For example, in a case where the resistance R1 is several-ten kΩ, it is good to set the ratio of the conductances Gm1 and Gm2 at about 100 so that the output impedance Z may become 75Ω. On the other hand, in consideration of mirror accuracy and consumption current, it is adequate to set the ratio of the conductances Gm1 and Gm2 at from several-ten to several-hundred. In this case, the current outputted from the first output terminal is several-ten to several-hundred times larger than the current outputted from the second output terminal.

In this manner, in the amplifier circuit according to the embodiment, since it is possible to adjust the output level at the time of termination by applying the feedback so that the output impedance may become 75Ω, the amplifier circuit can operate at a supply voltage of 3 V if the signal amplitude of the first output terminal is 1 Vpp.

According to the amplifier circuit of the present invention, since it is possible to adjust the output level at the time of termination by applying the feedback so that the output impedance may become 75Ω, the amplifier circuit can operate at a supply voltage of 3 V if the signal amplitude of the first output terminal is 1 Vpp, which is different from the output amplitude of 2 Vpp from a conventional video output amplifier circuit. Owing to this, it is possible to provide an amplifier circuit for video output that is operable at a supply voltage of 3 V. In this manner, since it is possible to use a supply voltage of 3 V in a portable apparatus such as a video camera, it is possible to achieve cost reduction by simplification of the construction of a power supply and performance improvement by lengthening continuous duty time of a battery.

In addition, it is possible to provide an amplifier circuit having excellent temperature stability since it is possible to construct the amplifier circuit so that its conductances do not change with temperature.

Furthermore, it is possible to make an output impedance and an input-output gain constant.

Moreover, it is possible to prevent a sag from arising in a video signal and to make stability good at the time of a terminating resistor not being there since it is possible to correct the reduction of a frequency characteristic.

What is claimed is:

1. An amplifier circuit for amplifying an input signal, said amplifier circuit comprising:

(A) first means for outputting a first output current proportional to a difference voltage between a first input voltage and a second in put voltage; and (B) second means for outputting a second output current proportional to a difference voltage between the first input voltage and the second input voltage, and for feeding back the second output current to said first means and said second means.

2. An amplifier circuit according to claim 1, wherein the first output current is made several-ten times to several-hundred times larger than the second output current.

3. An amplifier circuit according to claim 1, further comprising a first resistor connected between an output of said first means and an output of said second means and a second resistor connected between the output of said second means and a ground, and wherein an input signal is inputted to said first means and said second means and an output signal is outputted from the output of said first means.

4. An amplifier circuit according to claim 1, further comprising a first resistor connected between an output of said first means and an output of said second means, a second resistor connected between the output of said second means and a ground, a capacitor connected to the output of said first means, and means for feeding back an output of the capacitor to said first means and said second means, and wherein an input signal is inputted to the first means and said second means, and an output signal is outputted from said capacitor.

5. An amplifier circuit according to claim 1, further comprising a first resistor connected between an output of said first means and an output of said second means, a second resistor connected between the output of said second means and a ground, a first capacitor connected to the output of said first means, and a second capacitor connected between the first capacitor and the output of said second means, and wherein an input signal is inputted to said first means and said second means, and an output signal is outputted from said first capacitor.

6. An amplifier circuit according to claim 1, further comprising a bandgap circuit for generating a bandgap voltage, a current generating circuit for generating a current proportional to absolute temperature, said current generating circuit being composed of an NPN transistor element, a base terminal of which the bandgap voltage generated by said bandgap circuit is supplied to, and a resistor connected between an emitter terminal of said NPN transistor element and a ground, and a differential input circuit which operates by receiving a current proportional to the current generated by said current generating circuit as a drive current and which is connected to the first output terminal and the second output terminal.

7. An amplifier circuit according to claim 1, wherein said input signal is a video signal.

8. An amplifier circuit according to claim 1, wherein said amplifier circuit constitutes part of a video signal processing device.

9. An amplifier circuit according to claim 1, wherein said amplifier circuit constitutes part of a portable device driven by a battery.

* * * * *

UNITED STATES PATENT AND TRADEMARK OFFICE
CERTIFICATE OF CORRECTION

PATENT NO.    : 6,091,294
DATED         : July 18, 2000
INVENTOR(S)   : Takahiro Shirai et al.

It is certified that error appears in the above-identified patent and that said Letters Patent is hereby corrected as shown below:

Column 1,
Line 26, delete "is constructed" and insert -- is to be constructed --.

Column 2,
Line 57, delete "R+2" and insert -- R2+1 --.

Column 5,
Line 55, delete "in put" and insert -- input --.

Signed and Sealed this

Fourth Day of December, 2001

Attest:

NICHOLAS P. GODICI
*Attesting Officer*   *Acting Director of the United States Patent and Trademark Office*